United States Patent [19]

Yoshimura

[11] Patent Number: 4,488,124

[45] Date of Patent: Dec. 11, 1984

[54] RESONANT CAVITY WITH DIELECTRIC RESONATOR FOR FREQUENCY STABILIZATION

[75] Inventor: Yoshikazu Yoshimura, Osaka, Japan

[73] Assignee: Matsushita Electric Industrial Co., Ltd., Osaka, Japan

[21] Appl. No.: 299,395

[22] Filed: Sep. 4, 1981

[30] Foreign Application Priority Data

Dec. 10, 1980 [JP] Japan ................................ 55-174318

[51] Int. Cl.$^3$ ........................... H03B 9/14; H01P 7/06
[52] U.S. Cl. ............................... 331/107 DP; 331/96; 331/107 G; 333/230; 333/227
[58] Field of Search ............... 331/96, 107 SL, 107 R, 331/107 DP, 107 G, 115; 333/219, 227, 230, 232

[56] References Cited

U.S. PATENT DOCUMENTS

| 4,008,446 | 2/1977 | Hirai | 331/96 |
| 4,386,326 | 5/1983 | Yoshimura | 331/96 |

FOREIGN PATENT DOCUMENTS

| 0125746 | 11/1978 | Japan | 331/107 DP |
| 0126450 | 10/1979 | Japan | 331/117 D |
| 0005553 | 1/1980 | Japan | . |
| 0075310 | 6/1980 | Japan | 331/107 DP |

*Primary Examiner*—Siegfried H. Grimm
*Assistant Examiner*—W. R. Paxman

[57] ABSTRACT

A frequency stabilized oscillator includes a rectangular resonant cavity having a ground or short circuit wall, an H wall, and a top wall having an inductive window therein. A solid-state oscillating device such as a GUNN diode is attached at one end thereof to the short circuit wall, and a disk type dielectric resonator is supported from the short circuit wall and is located substantially adjacent the solid-state oscillating device so as to electromagnetically couple with the oscillating device. The inductive window is located so as to be in substantially overlying relationship with the dielectric resonator. A strip conductor is attached to the upper end of the oscillating device and extends through the H wall to the exterior of the oscillator to thereby provide a DC supply terminal for the oscillating device. The H wall of the resonant cavity is isolated from the DC supply applied to the strip conductor by means of a thin insulating layer between the strip conductor and the H wall. The capacitance formed between the strip conductor and the H wall is increased by increasing the width of the strip conductor at portions thereof which pass through the H wall. Thereby, the oscillator energy effectively passes directly through the strip conductor and the insulating layer back to the resonant cavity, while at the same time, preventing the DC supply applied to the oscillating device from being applied to the H wall.

5 Claims, 9 Drawing Figures

U.S. Patent   Dec. 11, 1984   Sheet 1 of 2   4,488,124
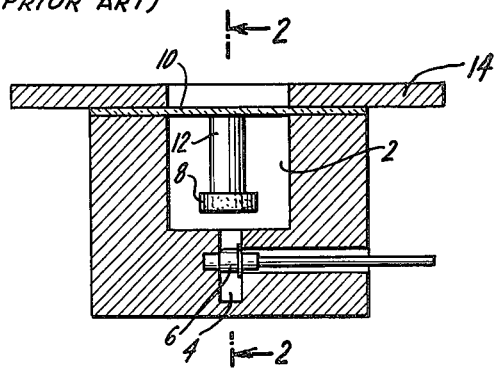
FIG. 1.
(PRIOR ART)
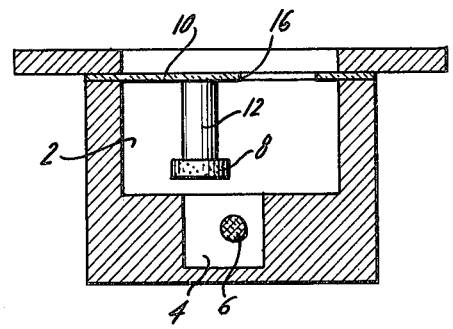
FIG. 2.
(PRIOR ART)
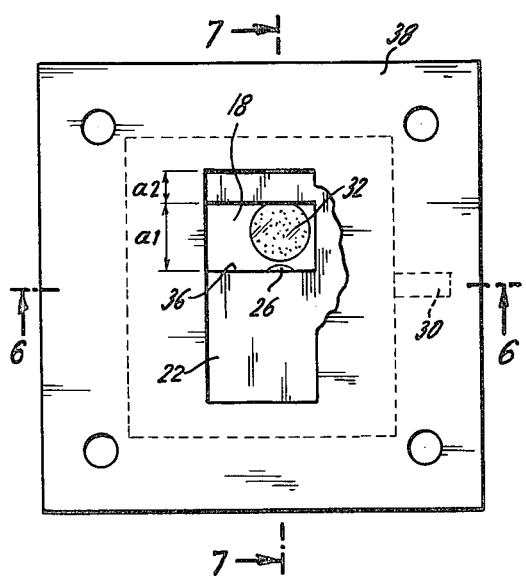
FIG. 3.
FIG. 4.
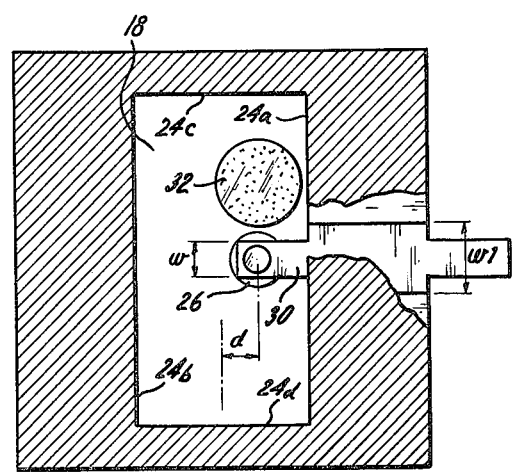
FIG. 5.

RESONANT CAVITY WITH DIELECTRIC RESONATOR FOR FREQUENCY STABILIZATION

DESCRIPTION OF THE INVENTION

The present invention is directed to the construction of a small sized microwave oscillator for use with a waveguide.

Microwave oscillators designed for use with microwave waveguides are generally well known. Microwave circuits which require a frequency stabilized source often utilize a solid-state microwave oscillator employing a solid-state oscillating device electromagnetically coupled to a dielectric resonator having a high Q and a high dielectric constant, to thereby produce a frequency stabilized output. In the prior art devices, the solid-state oscillating element is disposed in a recess formed in a wall of a cavity resonator, and the resonator is applied to a rectangular waveguide. The dielectric resonator is located adjacent to the recess in overlying relationship thereto, to thereby electromagnetically couple the resonator to the solid-state oscillator. Thus, a frequency stabilized oscillating output is supplied to the external waveguide through an inductive window.

Although such a structure provides a stable oscillation output, it is necessary to construct the oscillator such that its size in the axial direction is about ½ the waveguide wavelength at the oscillating frequency. Further, the mechanical formation of the recess into which the solid-state oscillator is disposed is made difficult due to its location within the wall of the cavity resonator.

It is therefore an object of the present invention to eliminate the above mentioned drawbacks associated with the prior art microwave oscillators.

It is a further object of the present invention to provide a small sized solid-state microwave oscillator, the length of which in its axial direction is approximately ¼ of the waveguide wavelength at the oscillating frequency.

Briefly, a frequency stabilized oscillator in accordance with the present invention includes a rectangular resonant cavity having a short circuit wall and a top wall opposite the short circuit wall. A solid-state oscillating device is connected at one end to the short circuit wall, and a dielectric resonator is supported from the short circuit wall and located substantially adjacent to the oscillating device. An inductive window in substantial overlying relationship with respect to the dielectric resonator is provided in the rectangular resonant cavity.

More specifically, the rectangular resonant cavity has an H wall, an E wall, a short circuit wall, and a top wall having the inductive window therein. The solid-state oscillating device, its one end connected to the short circuit wall, has its outer end connected to a strip conductor which extends through the H wall to the exterior of the cavity to thereby provide a DC supply terminal for the oscillating device. The dielectric resonator is of the disc-type having a high Q and a high dielectric constant. The dielectric resonator is located with respect to the oscillating device so as to electromagnetically couple to the oscillating device to thereby provide a frequency stabilized output through the inductive window when a voltage is applied to the strip conductor.

In accordance with preferred embodiments of the present invention, the dielectric resonator is supported from the short circuit wall by a support, the distance between the short circuit wall and the dielectric resonator being approximately equal to the distance between the dielectric resonator and the top wall. The strip conductor is isolated from the H wall by a thin insulating layer and has a first width inside the resonant cavity and at the exterior of the resonant cavity, and a second width greater than the first width inside the H wall, whereby capacitive coupling between the strip conductor and the H wall is enhanced such that the oscillator energy effectively passes directly through the strip conductor and the insulating layer back to the resonant cavity, while at the same time, preventing the DC supply applied to the oscillating device from being applied to the H wall. A conductive screw may be extended through the E wall to provide a fine frequency adjustment of the oscillating output.

These and other subjects will be discussed in more detail with reference to the following drawing Figures of which:

FIG. 1 is a front sectional view of a conventional frequency stabilized solid-state oscillating device;

FIG. 2 is a side cross-sectional view of the conventional frequency stabilized solid-state oscillating device shown in FIG. 1;

FIG. 3 is a front view of the frequency stabilized oscillator in accordance with the present invention attached to a waveguide coupler;

FIG. 4 is a top view of the waveguide coupler and frequency stabilized oscillator illustrated in FIG. 3;

FIG. 5 is a cross-sectional view of the frequency stabilized oscillator taken along line 5—5 of FIG. 3;

Figure 6:
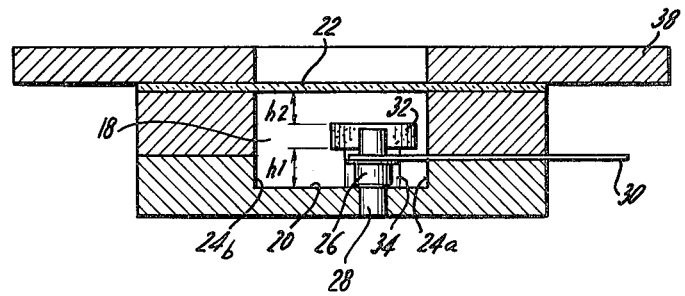
FIG. 6 is a cross-sectional view of the frequency stabilized oscillator and waveguide coupler taken along line 6—6 of FIG. 4.
Figure 7:
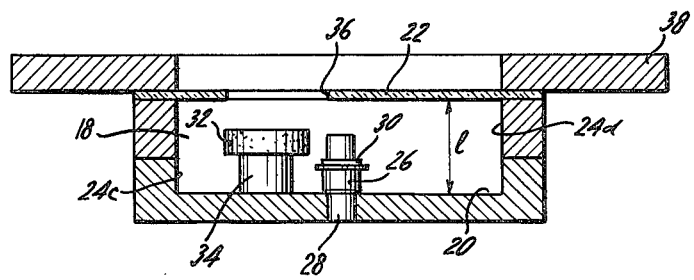
FIG. 7 is a cross-sectional view of the frequency stabilized oscillator and waveguide coupler taken along line 7—7 of FIG. 4.

With reference to FIGS. 1 and 2, prior art frequency stabilized oscillators were generally constructed with a rectangular resonant cavity 2 having a recess 4 formed in the bottom wall of the resonant cavity. A solid-state oscillating device 6 is disposed in the recess 4, and a plate dielectric resonator 8 is suspended from resonator top wall 10 by post means 12, such that resonator 8 is disposed adjacent recess 4 in partial overlying relationship therewith. The dielectric resonator 8 typically is provided with a high Q and a high dielectric constant to thereby provide a frequency stabilized oscillating output in combination with the solid-state oscillating device 6. The oscillating output is provided to waveguide coupler 14 via an inductive window 16 provided in the resonator top wall 10.

Although the prior art structure provides a stable frequency source for microwave circuits, it is inadequate for many applications in the following respects. First, the dimensions of the frequency stabilized oscillator from the top wall to the bottom wall of the resonator is approximately ½ wave length of the oscillating frequency, and is thus unduly large for applications which require highly compact structures. Secondly, the process of mechanically forming the recess 4 is difficult in nature and substantially increases the cost of such devices.

The frequency stabilized oscillator in accordance with the present invention, however, avoids the abovementioned difficulties associated with the prior art devices. With reference to FIGS. 3–8, a rectangular resonant cavity 18 is defined between short circuit or ground plane wall 20, top wall 22 separated by distance l from wall 20, and side walls 24a–24d, side wall 24a being an H wall. A solid-state oscillating device 26 is secured to circular aperture 28 in the short circuit wall 20, the heat radiating end of the solid-state oscillating device 26 preferably being disposed within aperture 28. The aperture 28 is located in the center of the short circuit wall between side walls 24c and 24d, but is displaced from the center of the short circuit wall between the side walls 24a and 24b by distance d, aperture 28 being closer to side wall 24a.

Strip conductor 30 is connected to the upper end of the solid-state oscillating device and has a width w in the direction of side walls 24c and 24d. The strip conductor extends from the solid-state oscillating device to side wall 24a (H wall) and extends perpendicularly therethrough to thereby provide a DC supply to the solid state oscillating device. Strip conductor 30 is isolated from the H wall by a thin insulating layer provided between the H wall and the strip conductor. Also, the width of the strip conductor in the direction of side walls 24c and 24d at the portion of the strip conductor which intersects the H wall is w1 which is greater than w for reasons to be explained below.

A disk-type dielectric resonator 32 is disposed within the rectangular resonant cavity 18 generally parallel with short circuit wall 20 but separated therefrom by supporting member 34 having a relatively small thermal expansion coefficient, such as quartz. The disk-type dielectric resonator 32 should have a high Q and a high dielectric constant, and is located a distance h1 from short circuit wall 20 and distance h2 from top wall 22. In accordance with the specific embodiment illustrated in FIGS. 4–8, the center of dielectric resonator 32 may be located the same distance d closer to side wall 24a than to side wall 24b as the solid-state oscillating device 26. Further, as best illustrated in FIG. 5, dielectric resonator 32 is disposed to one side of the solid-state oscillating device, and specifically between the solid-state oscillating device and wall 24c.

Inductive window 36 extending from side wall 24a to 24b and having width a1 in the direction of said side wall 24c and 24d, is provided in top wall 22. The inductive window 36 is provided in a substantially overlying relationship with dielectric resonator 32, and in the case of the embodiment of FIGS. 4–8, is located a distance a2 from side wall 24c.

Finally, wave guide coupler 38 is provided on top of top wall 22 to thereby allow connection of the frequency stable oscillator to a waveguide.

In accordance with the construction of the frequency stabilized oscillator as described hereinabove, the distance l between short circuit wall 20 and top wall 22 may be less than ¼ of the wavelength of the resonant frequency of the cavity. However, it may not be so low as to reduce the resonance of dielectric resonator 32 by more than 1 octave, since such may reduce the electromagnetic coupling between the solid-state oscillating device and the resonator. Determination of the values of the various named dimensions will be discussed in detail below.

Figure 8:
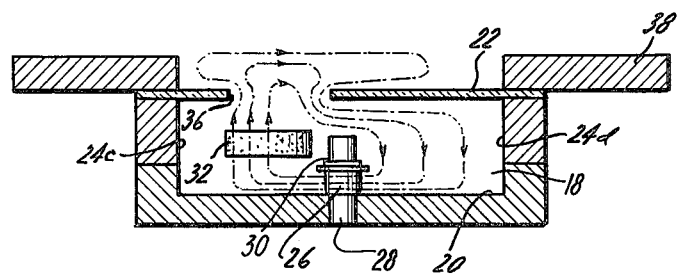
FIG. 8 is a cross sectional view along line 7—7 of FIG. 4 showing the microwave magnetic field produced by the magnetic coupling between the solid-state oscillating device and dielectric resonator in the frequency stabilized oscillator.

FIG. 8 illustrates the electromagnetic coupling between the solid-state oscillating device 26, dielectric resonator 32, rectangular resonant cavity, and the external microwave circuit with the aid of a microwave magnetic field illustration. It can be seen that the microwave magnetic field generated by the solid-state oscillating device is maintained at the narrow space between the strip conductor 30 and the short circuit wall 20, and that the magnetic lines of force become oriented perpendicular thereto at locations further removed from short circuit wall 20 on either side of the conductive strip. Thus, conductive strip 30 should be narrow within the rectangular resonant cavity so as not to interfere with the magnetic field. On the other hand, this arrangement may induce a certain amount of leakage of oscillator energy from the resonant cavity through the conductive strip. Such leakage may be reduced by providing a high capacitance between the strip conductor 30 and the H wall such that the oscillating signal effectively passes directly through the conductive strip and insulating film back to the resonant cavity, while at the same time, preventing the DC supply voltage delivered to the oscillating device from being applied to the side wall. This is accomplished by providing an adequately thin insulating film between the strip conductor and wall 24a, and by providing the conductive strip with a wider dimension w1 at its area of contact with the side wall 24a.

As illustrated in FIG. 8, the oscillations are electromagnetically coupled from the resonant cavity to the microwave coupler via the inductive window 36. The microwave magnetic field generated by the solid-state oscillating device 26 induces the lowest H mode magnetic field of the dielectric resonator 32. As mentioned above, the resonant oscillations are dominated by the dielectric resonator having a high Q and high dielectric constant.

Figure 9:
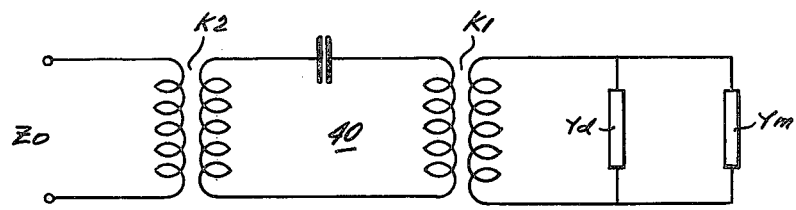
FIG. 9 is a schematic illustration of the equivalent electric circuit produced by the frequency stabilized oscillator.

FIG. 9 is a schematic illustration of the lumped circuit element equivalent of the solid-state frequency stabilized oscillator in accordance with the present invention. In FIG. 9, Yd is the admittance of the solid-state oscillating device and has a negative conductance. Ym is the susceptance of the strip conductor attached to the solid-state oscillating device. The high Q series resonant circuit 40 is the circuit equivalent of the dielectric resonator 32. The coupling between the solid-state oscillating device 26 and the dielectric resonator is illustrated as coupling coefficient K1 and the coupling between the dielectric resonator and the external circuit is illustrated as coupling coefficient K2. Zo illustrates the load impedance of the external circuit.

In practice, the dimensions l, h1 and h2, maybe determined empirically such that the unloaded Q of the dielectric resonator remains high. Generally the close proximity of the dielectric resonator to short circuit wall 20 or inductive window 36 may tend to reduce the unloaded Q of the dielectric window. Thus, in the embodiment according to the present invention, h1 is approximately equal to h2. The distance d of the solid-state oscillating device from the center of the rectangular resonant cavity, the widths w and w1 of the strip conductor and the size a1 and position a2 of the inductive window 36 may be determined empirically in order to stabilize variations of the oscillating frequency $\Delta f_T$ due to changes of temperature, stabilize variations in the oscillator frequency $\Delta f_L$ due to variations in the load, and to maintain a desired oscillator output power $P_0$.

In a working embodiment of the present invention the solid-state oscillating element is a GUNN diode operating at 7.5 volts and 160 mA and having a standard frequency and output power of 11.0 Ghz and 45 dbm, respectively. The dielectric resonator is a ceramic circular disk-type resonator with a 5 mm diameter, a relative dielectric constant of 37.6, an unloaded Q of 4,000, and a temperature coefficient at resonant frequency of 4.1 ppm/° C. The rectangular waveguide may be the type designated WRJ-120. The dimensions of h1 and h2 are approximately 1.5 mm, and l is approximately equal to 5.3 mm. Under the above conditions, $f_0=11.230$ GHz, $P_0=9.6$ mW, $\Delta f_T=480$ KHz, $\Delta f_L=460$ KHz.

The oscillating frequency of the frequency stabilized oscillator in accordance with the present invention may be controlled by varying the thickness of the disk-type dielectric resonator 32. In the event that fine adjustments to the oscillating frequency are necessary, a frequency adjustment member such as a conductive screw may be inserted through the E wall 24c adjacent to the dielectric resonator 32.

Thus, the frequency stabilizer oscillator in accordance with the present invention requires a rectangular resonant cavity which is substantially smaller along the dimension l than the prior art devices, while at the same time maintaining a highly stable oscillating output over a wide range of operating conditions. The oscillator in accordance with the present invention therefore readily lends itself to many uses.

What I claim is:

1. A frequency stabilized oscillator comprising:
A rectangular resonant cavity having four side walls including an H wall and an E wall positioned adjacent to and perpendicular to said H wall, a short circuit wall positioned so as to close one of two openings formed by said four side walls, and a top wall positioned opposite to said short circuit wall so as to close the other opening formed by the four side walls, said top wall having a window, the distance between said short circuit wall and said top wall being less than one fourth of the wavelength of the resonant frequency of the resonant cavity;
a solid state oscillating device having one end connected to said short circuit wall;
a strip conductor disposed parallel to said short circuit wall, and extending perpendicularly through said H wall to the exterior of said cavity to thereby provide a DC supply terminal for said oscillating device; and
a disc-type dielectric resonator having a high Q and a high dielectric constant located between said oscillating device and said E wall so as to be electromagnetically coupled to said oscillating device, whereby a frequency stabilized oscillating output is provided through said window when a voltage is applied to said strip conductor.

2. The oscillator of claim 1 wherein said dielectric resonator is supported from said short circuit wall by support means and said window is positioned in substantial overlying relationship with said dielectric resonator.

3. The oscillator of claim 2 wherein the distance between said short circuit wall and said dielectric resonator is approximately equal to the distance between said dielectric resonator and said top wall.

4. The oscillator of claims 2 or 3 wherein said dielectric resonator is positioned adjacent said oscillating device.

5. The oscillator of claims 1, 2 or 3 wherein said strip conductor is isolated from said H wall by a thin insulating layer and has a first width inside said resonant cavity and at the exterior of said resonant cavity, and a second width greater than said first width inside said H wall, whereby capacitive coupling between said strip conductor and said H wall is enhanced such that the oscillator energy effectively passes directly through said strip conductor and said insulating layer back to said resonant circuit, while maintaining said H wall isolated from said voltage applied to said strip conductor.

* * * * *